(12) United States Patent  
Plettner et al.

(10) Patent No.: US 8,618,513 B2  
(45) Date of Patent: Dec. 31, 2013

(54) APPARATUS AND METHODS FOR FORMING AN ELECTRICAL CONDUCTION PATH THROUGH AN INSULATING LAYER

(75) Inventors: Tomas Plettner, San Ramon, CA (US); Mehran Nasser-Ghodsi, Hamilton, MA (US); Robert G. Haynes, Pleasanton, CA (US); Rudy F. Garcia, Union City, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/468,617

(22) Filed: May 10, 2012

(65) Prior Publication Data

US 2012/0298879 A1  Nov. 29, 2012

Related U.S. Application Data

(60) Provisional application No. 61/488,940, filed on May 23, 2011.

(51) Int. Cl.  
*G21K 5/00* (2006.01)

(52) U.S. Cl.  
USPC .................. 250/492.1; 250/493.1; 250/504 R

(58) Field of Classification Search  
USPC ................. 250/492.1, 492.2, 492.21, 492.22, 250/492.3, 396 R, 397  
See application file for complete search history.

(56) References Cited

U.S. PATENT DOCUMENTS

| | | | |
|---|---|---|---|
| 3,939,743 A | 2/1976 | Coombes | |
| 4,066,943 A | 1/1978 | Roch | |
| 6,114,865 A | 9/2000 | Lagowski et al. | |
| 6,605,955 B1 | 8/2003 | Costello et al. | |
| 6,842,029 B2 | 1/2005 | Howland | |
| 2003/0227292 A1 | 12/2003 | Howland | |
| 2004/0159287 A1* | 8/2004 | Hoffman et al. | 118/728 |
| 2007/0199656 A1 | 8/2007 | Leavitt et al. | |
| 2008/0124850 A1* | 5/2008 | Takayama et al. | 438/166 |
| 2008/0237578 A1* | 10/2008 | Levy | 257/24 |

* cited by examiner

*Primary Examiner* — Nicole Ippolito  
(74) *Attorney, Agent, or Firm* — Okamoto & Benedicto LLP

(57) ABSTRACT

One embodiment disclosed relates to an apparatus forming an electrical conduction path through an insulating layer on a surface of a substrate. A first radiation source is configured to emit radiation to a first region of the insulating layer, and a first electrical contact is configured to apply a first bias voltage to the first region. A second radiation source is configured to emit radiation to a second region of the insulating layer, and a second electrical contact is configured to apply a second bias voltage to the second region. The conductivities of the regions are increased by the radiation such that conductive paths are formed through the insulating layer at those regions. In one implementation, the apparatus may be used in an electron beam instrument. Another embodiment relates to a method of forming an electrical conduction path through an insulating layer. Other embodiments, aspects and features are also disclosed.

19 Claims, 8 Drawing Sheets

800

APPARATUS AND METHODS FOR FORMING AN ELECTRICAL CONDUCTION PATH THROUGH AN INSULATING LAYER

CROSS-REFERENCE TO RELATED APPLICATION(S)

The present application claims the benefit of U.S. provisional patent application No. 61/488,940, filed May 23, 2011, by inventors Tomas Plettner et al., the disclosure of which is hereby incorporated by reference in its entirety.

BACKGROUND

1. Field of the Invention

The present invention relates to technology for forming an electrical path through an insulating layer.

2. Description of the Background Art

It is often desirable to electrically ground a substrate through an insulating layer on its surface. The substrate may be, for example, a silicon wafer or other semiconductor substrate. The insulating layer may be, for example, an oxide or nitride layer on a surface of the substrate.

For example, in an electron beam inspection apparatus, a mechanism is typically used to ground a silicon wafer being inspected through its backside, where the backside is the side away from the integrated circuitry being manufactured. The conventional mechanism presses sharp pins of a hard metal against the insulating layer on the wafer backside to force electrical conduction paths from the pins to the bulk silicon wafer by either mechanical destruction of the insulating layer under the pins, or electrical arcing from the pins through the insulating layer, or a combination of both.

Unfortunately, this conventional mechanism causes irreversible damage (electrical and/or mechanical) to the wafer backside. For example, an oxide layer on the backside of a silicon wafer may be scratched, or otherwise mechanically damaged by the sharp grounding pins, so as to expose the bulk silicon. Subsequently, as the wafer continues in the fabrication process, an etch process may be applied that inadvertently and undesirably etches the exposed silicon on the backside. In addition, if the oxide layer is very thick, the mechanical damage may be substantial enough to cause debris particles near the damaged area that may introduce misalignment of the wafer.

SUMMARY

One embodiment disclosed relates to an apparatus forming an electrical conduction path through an insulating layer on a surface of a substrate. In the case where charging of the substrate in question can be either negative or positive, two contacts with their respective radiation sources and with opposite bias polarities may be provided in the apparatus to allow for draining of either positive or negative charging. The first radiation source is configured to emit radiation to a first region of the insulating layer, and a first electrical contact is configured to apply a first bias voltage to the first region in a way that can drain the charge that is being deposited on the substrate. The second radiation source is configured to emit radiation to a second region of the insulating layer, and a second electrical contact is configured to apply a second bias voltage to the second region. The conductivities of the first and second regions are increased by the radiation such that conductive paths are formed through the insulating layer at those regions. In one implementation, the apparatus may be part of a wafer carrier and may be used in an electron beam imaging instrument.

Another embodiment relates to a method of forming an electrical conduction path through an insulating layer. Radiation is emitted to a first region of the insulating layer, and a first bias voltage is applied to the first region. Radiation is emitted to a second region of the insulating layer, and a second bias voltage is applied to the second region. The conductivities of the first and second regions are increased by the radiation such that conductive paths are formed through the insulating layer at those regions. In one implementation, the method may be used in an electron beam imaging instrument to ground the substrate through the insulating layer.

Other embodiments, aspects and features are also disclosed.

DETAILED DESCRIPTION

Figure 1:
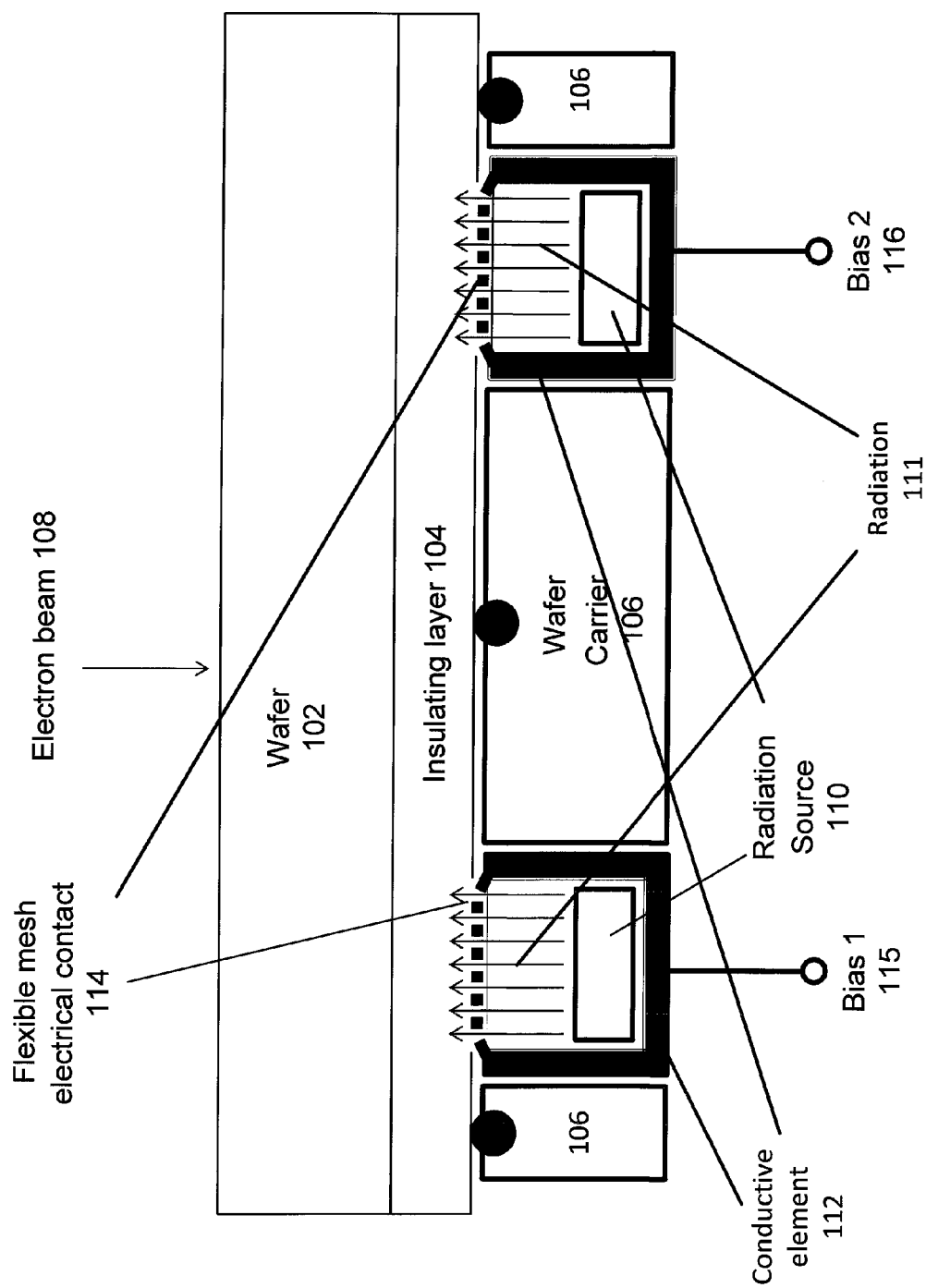
FIG. 1 is a cross-sectional diagram of an apparatus to form an electrical conduction path through an insulating layer in accordance with an embodiment of the invention.

FIG. 1 is a cross-sectional diagram of an apparatus 100 to form an electrical conduction path through an insulating layer in accordance with an embodiment of the invention. The apparatus 100 may be used to provide a mechanism that carries electrical current across an insulating layer (or layers) 104 that may range from less than one nanometer to several microns in thickness. Advantageously, mechanical damage to, and electrical breakdown of, the insulating layer may be avoided using the apparatus 100.

As depicted in FIG. 1, the insulating layer 104 may be, for example, a layer of oxide and/or nitride formed on the backside of a semiconductor wafer 102. The apparatus 100 may also be employed to form an electrical conduction path through other insulating layers. The backside 104 of the wafer 102 may rest on a wafer carrier 106.

As indicated in FIG. 1, the apparatus 100 may be utilized in an electron beam (e-beam) imaging instrument, such as, for example, an automated e-beam inspection instrument. Such an e-beam imaging instrument may focus an incident electron beam 108 onto the front-side of the wafer 102. The electron beam 108 comprises a current of negative charges to the bulk of the wafer 102. This negative charge current may build up an unwanted charge in the wafer 102. As described herein, the apparatus 100 of FIG. 1 provides a non-destructive mechanism for draining the unwanted charge build-up in the wafer 102.

In accordance with an embodiment of the invention, in order to provide an electrical conduction path to drain the unwanted charge build-up without damaging the insulating layer, one or more electrical contacts 114 and one or more radiation sources 110 may be utilized. In the exemplary implementation shown in FIG. 1, there are two flexible mesh electrical contacts 114 that contact the insulating layer 104 of the wafer 102 and two radiation sources 110 in the vicinity of the contacts 114. As shown, each radiation source 110 may be arranged to emit radiation 111 through the openings of a corresponding contact mesh 114.

Bias voltages (Bias1 115 and Bias 2 116) are applied to the contact meshes 114 by way of a conductive element 112. The conductive element 112 may, but does not need to, be part of a unit that surrounds the radiation source 110.

The insulating layer 104 generally has a threshold electric field above which it breaks down. This threshold electric field may be referred to as the electrical breakdown field and depends on the material characteristics of the insulating layer 104. In accordance with an embodiment of the invention, each bias voltage (115 and 116) is preferably kept below the voltage which would cause electrical breakdown of the insulating layer 104. In other words, the electric fields caused by the bias voltages are preferably kept below the electrical breakdown field.

The radiation sources 110 are chosen and arranged to add energy to the regions of the insulating layer 104 which are affected by the electric fields caused by the bias voltages (115 and 116). The radiation sources 110 may be advantageously configured to emit radiation 111 that serves to promote electrons into the conduction band, and/or holes into the valence band.

In one embodiment, the radiation sources 110 may directly create electron-hole pairs within the insulating layer 104 by adding ionizing radiation. The ionizing radiation may be in the form of alpha particles, ion beams, high-energy photons, or electron beams. In a preferred embodiment, the ionizing radiation may be alpha particles emitted using a radioactive americium (Am) source.

In another embodiment, the radiation sources 110 may cause photon-assisted injection of charge from the interface of the insulating layer 104 into the bulk of the insulating layer 104. Depending on the photon's energy that is employed, the charge may be either photo-emitted or tunneled into the insulating layer's conduction band. In certain embodiments, photons at ultraviolet (UV) or deep UV wavelengths may be used.

In yet another embodiment, thermal injection of charge into the conduction band may be utilized. Thermal injection has been observed to be effective with nitride layers, for example.

Figure 2:
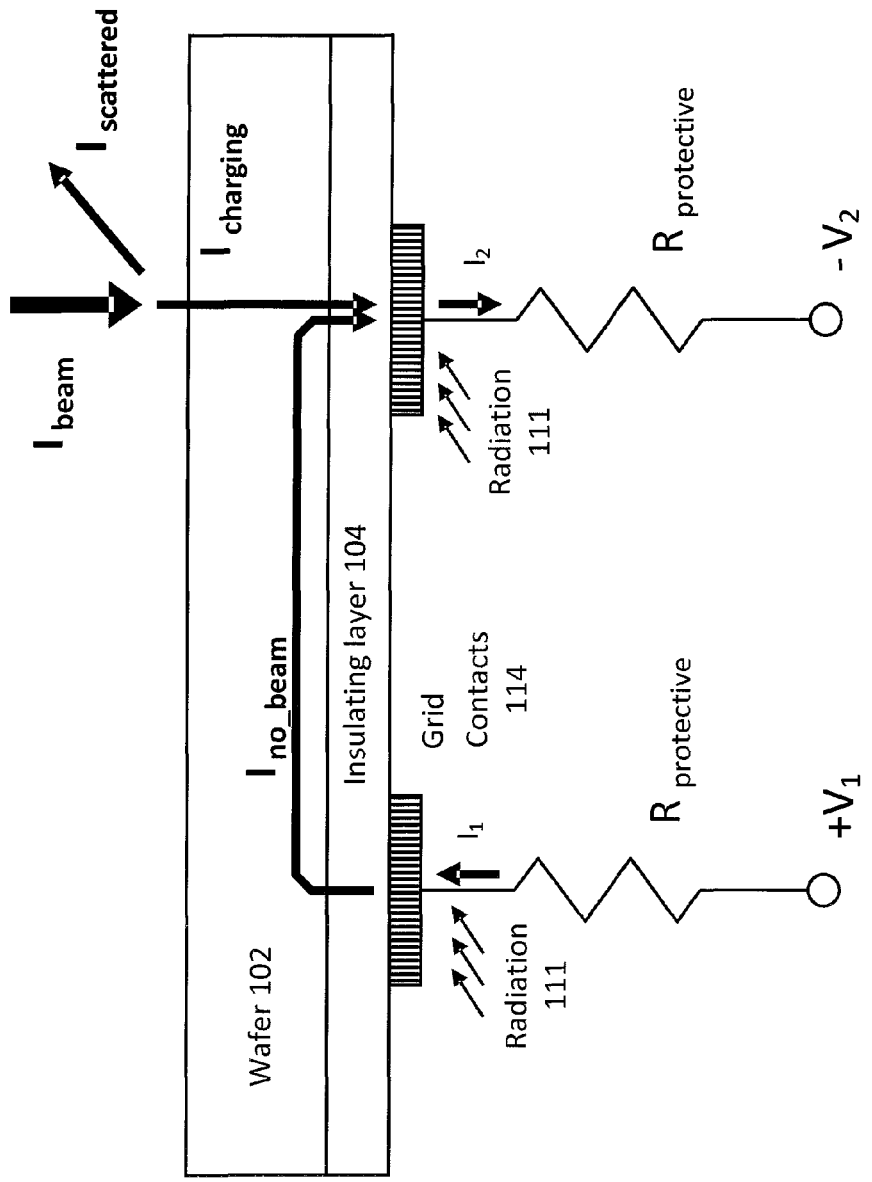
FIG. 2 is an electrical grounding diagram of the apparatus in accordance with an embodiment of the invention.

FIG. 2 is an electrical grounding diagram 200 of the apparatus 100 in accordance with an embodiment of the invention. A first bias voltage of $+V_1$ may be applied by a first voltage source through a first protective resistor $R_{protective}$ to a first grid contact 114, and a second bias voltage of $-V_2$ may be applied by a second voltage source through a second protective resistor $R_{protective}$ to a second grid contact 114. The protective resistors may be selected to have sufficient resistance to limit the maximum current flowing between the two grid contacts 114 so as to avoid damage to the voltage sources.

Radiation 111 is emitted so that it impinges upon the insulating layer 104 through the grid contacts 114. The radiation 111 advantageously causes the promotion of electrons into the conduction band, and/or holes into the valence band, in the regions of the insulating layer 104 which is under the electric fields. As a result, a conductive path for electronic current is created through the insulating layer 104 in the region above each of the grid contacts 114.

A first electrical current $I_1$ may then flow through the first grid contact 114, and a second electrical current $I_2$ may then flow through the second grid contact 114. As shown in the electrical grounding diagram 200, the first electrical current (the "source" current) $I_1 = I_{no\_beam}$ which flows between the first and second grid contacts 114, and the second electrical current (the "drain" current) $I_2 = I_{no\_beam} + I_{charging}$, where $I_{charging}$ is the electrical current due to charging from the electron beam 108 impinging upon the wafer 102. From Kirchhoff's law, $I_{charging} = I_{beam} - I_{scattered}$, where $I_{beam}$ is the electron beam current and $I_{scattered}$ is the scattered electron current.

Conceptually, the first grid contact 114 with the positive voltage bias $(+V_1)$ sources electrons, while the second grid contact 114 with the negative voltage bias $(-V_2)$ drains electrons. The potential drop across the insulating layer 104 is relatively large, but of opposite signs for each contact. The net potential $(V_1+V_2)$ is relatively small and may be adjusted to be zero. As shown, there is current $(I_{no\_beam})$ that flows through the wafer 102 even in the absence of the electron beam 108 (i.e. even with $I_{beam}=0$). When the electron beam is present, the addition of the charging current $(I_{charging})$ offsets the wafer bias, so a key parameter is the slope of the current versus bias (i.e. the small signal impedance). The beam current induced offset may be "re-adjusted" to zero (i.e. canceled) by applying a bias offset such that $V_1$ is not equal to $V_2$.

Figure 3:
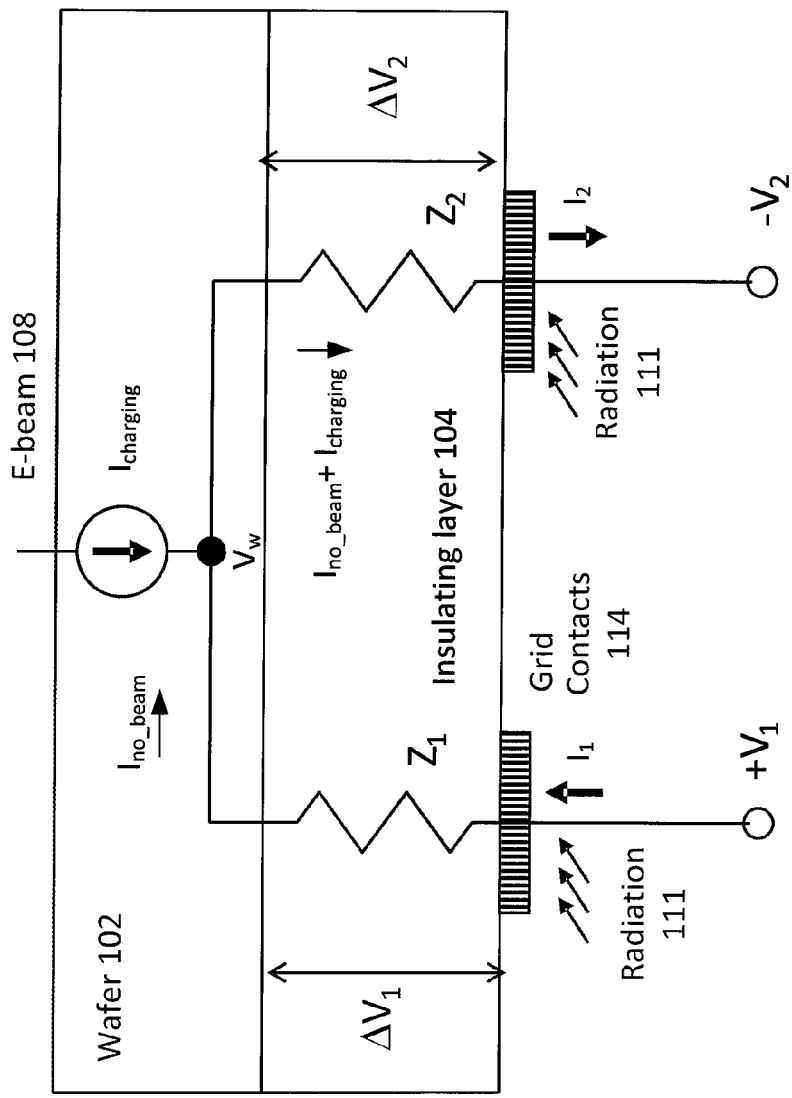
FIG. 3 shows an equivalent circuit in accordance with an embodiment of the invention.

FIG. 3 shows an equivalent circuit 300 in accordance with an embodiment of the invention. As shown, a first impedance $Z_1$ is effectively present between the first voltage source at the voltage $+V_1$ (the "source" voltage) and the bulk of the wafer 102 at voltage $V_W$, and a first impedance $Z_2$ is effectively present between the bulk of the wafer 102 at voltage $V_W$ and the second voltage source at the voltage $-V_2$ (the "drain" voltage). $Z_1$ is approximately equal to the small-signal impedance value for the positively-biased region of the insulating layer 104, and $Z_2$ is approximately equal to the small-signal impedance value for the negatively-based region of the insulating layer 104. From Ohm's law, $\Delta V_1 = V_1 - V_W = I_1 Z_1$, and $\Delta V_2 = V_W - (-V_2) = V_W + V_2 = I_2 Z_2$. As discussed above in relation to FIG. 2, $I_1 = I_{no\_beam}$, and $I_2 = I_{no\_beam} + I_{charging}$.

Figure 4:
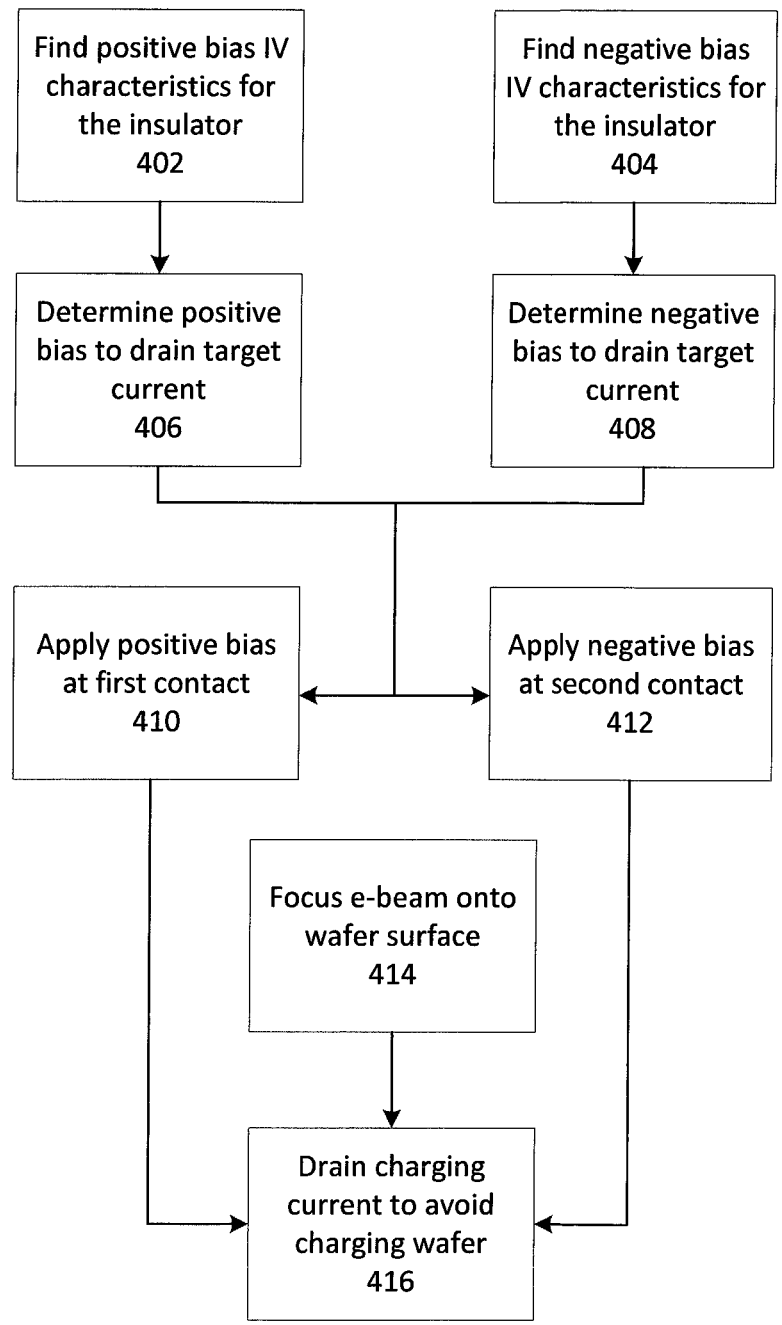
FIG. 4 is a flow chart of a method for selecting and applying bias voltages of the backside contacts in accordance with an embodiment of the invention.

FIG. 4 is a flow chart of a method 400 for selecting and applying bias voltages of the backside contacts in accordance with an embodiment of the invention. Positive bias current-voltage (IV) characteristics are found 402 for the insulating layer 104, and a determination may be made 406 from the positive I-V characteristics as to the positive bias 115 $(+V_1)$ to apply to the first mesh contact 114 so as to achieve a target current for $I_{no\_beam}$. In addition, negative bias IV characteristics are found 404 for the insulating layer 104, and a determination may be made 408 from the negative I-V characteristics as to the negative bias 116 $(-V_2)$ to apply to the second mesh contact 114 so as to achieve a target current for $I_{no\_beam}$.

The positive bias 115 $(+V_1)$ is applied to the first contact 114, and the negative bias 116 $(-V_2)$ is applied to the second contact 114 so that the targeted current of $I_{no\_beam}$ should flow in the absence of an electron beam 108. If the wafer 102 is within an e-beam instrument, then the e-beam 108 may be focused 414 onto the surface of the wafer 102. The charging current $I_{charging}$ due to the beam 108 is then drained 416 as part of the second electrical $I_2$ through the second contact 114.

This method 400 advantageously grounds the wafer 102 to avoid charge build-up in a non-destructive manner. Unlike conventional grounding techniques which employ a ground (zero) potential at the electrical pin contacts, the method 400 disclosed herein employs non-zero potentials at the electrical contacts to achieve an essentially neutral (zero or near zero) potential in the wafer bulk.

Figure 5:
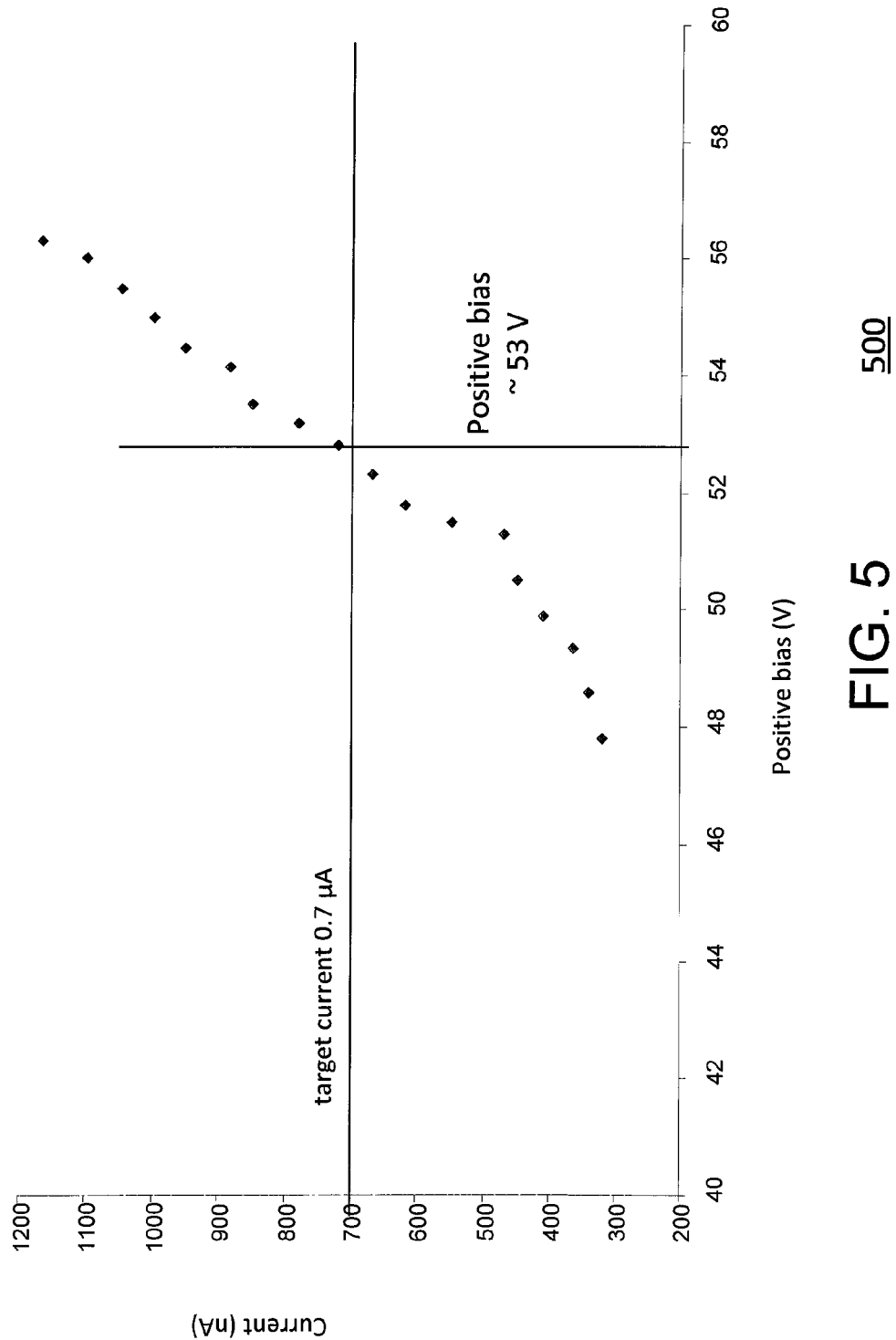
FIG. 5 shows a positive bias current-voltage characteristic curve for an example insulating layer in accordance with an embodiment of the invention.
Figure 6:
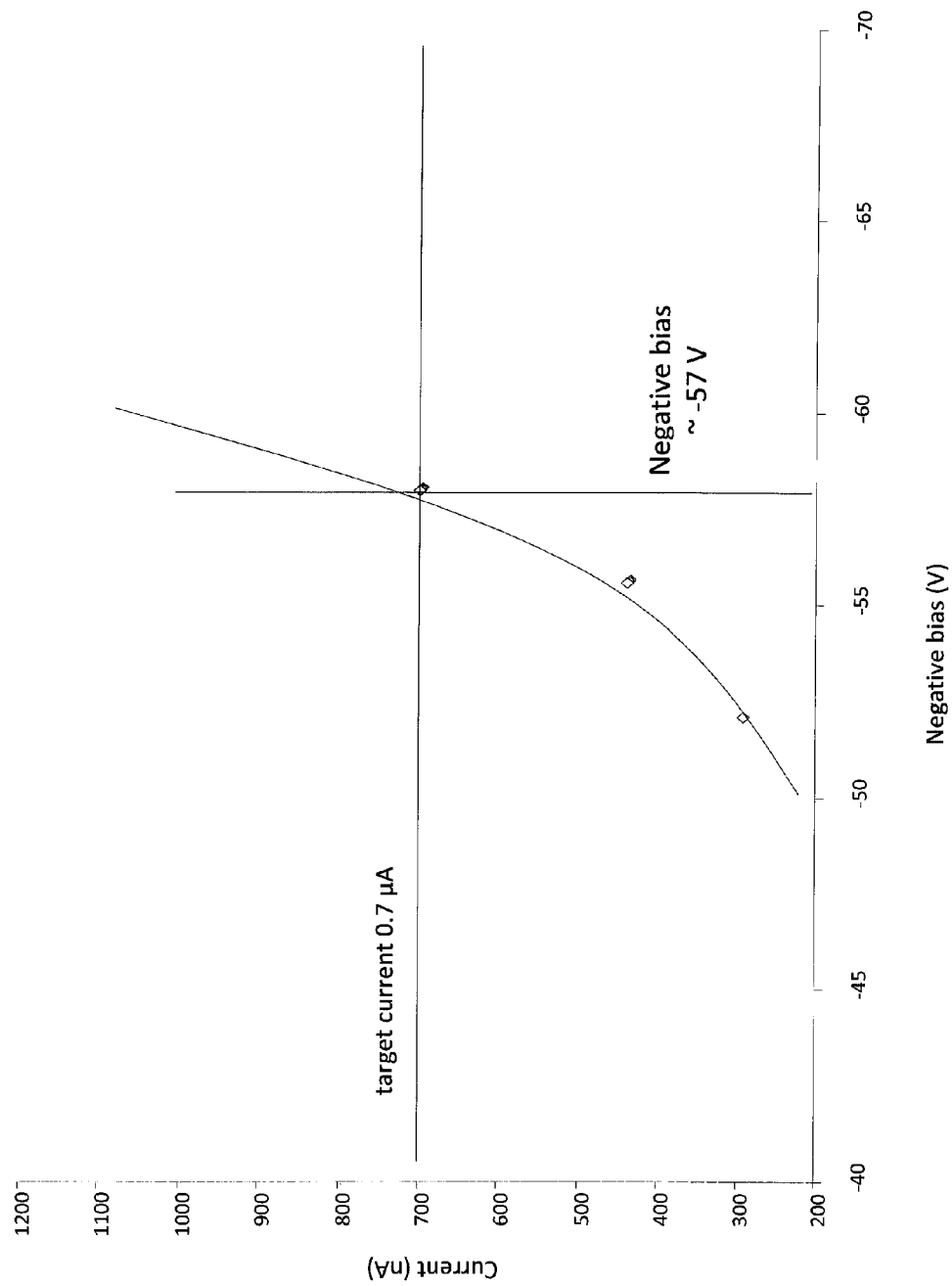
FIG. 6 shows a negative bias current-voltage characteristic curve for the example insulating layer in accordance with an embodiment of the invention.
Figure 7:
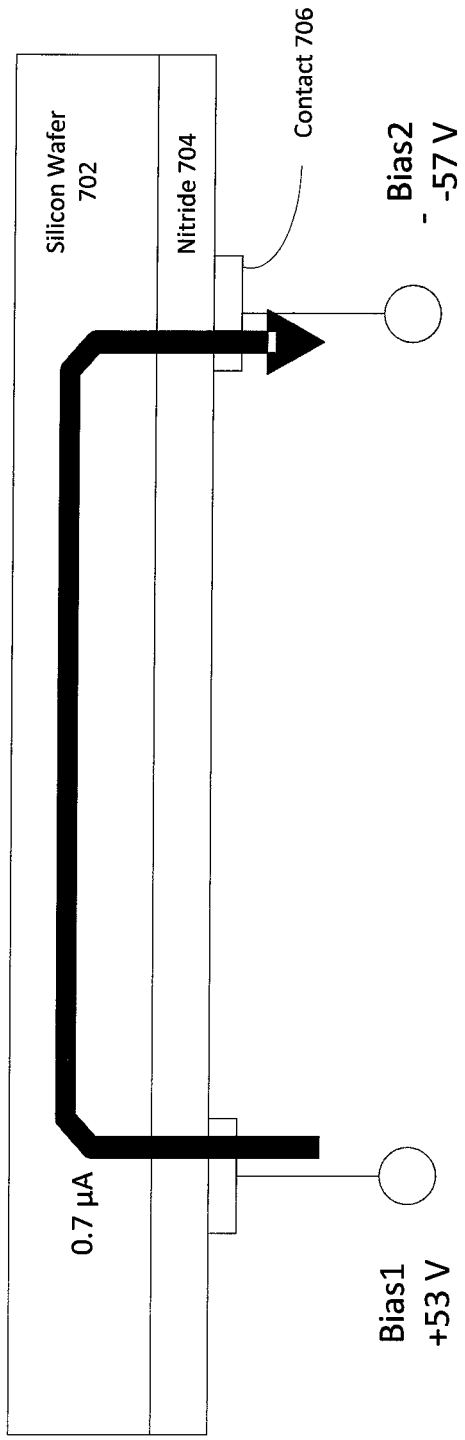
FIG. 7 shows the bias voltages determined from the curves as applied to the example insulating layer in accordance with an embodiment of the invention.

FIG. 5 shows a positive bias current-voltage characteristic curve 500 for an example insulating layer in accordance with an embodiment of the invention, and FIG. 6 shows a negative bias current-voltage characteristic curve for the example insulating layer in accordance with an embodiment of the invention. The example insulating layer is a nitride layer 704 on a backside of a silicon wafer 702 as depicted in FIG. 7.

As shown in FIGS. 5 and 6, an electrical current of 0.7 microamperes (µA) may be targeted. From the I-V curves in FIGS. 5 and 6, it is seen that this target current is reached at a positive bias of about +53 volts and a negative bias of about −57 volts. In accordance with steps 410 and 412 in FIG. 4, these bias voltages may be applied, respectively, to the first and second contacts 706 as depicted in FIG. 7.

Figure 8:
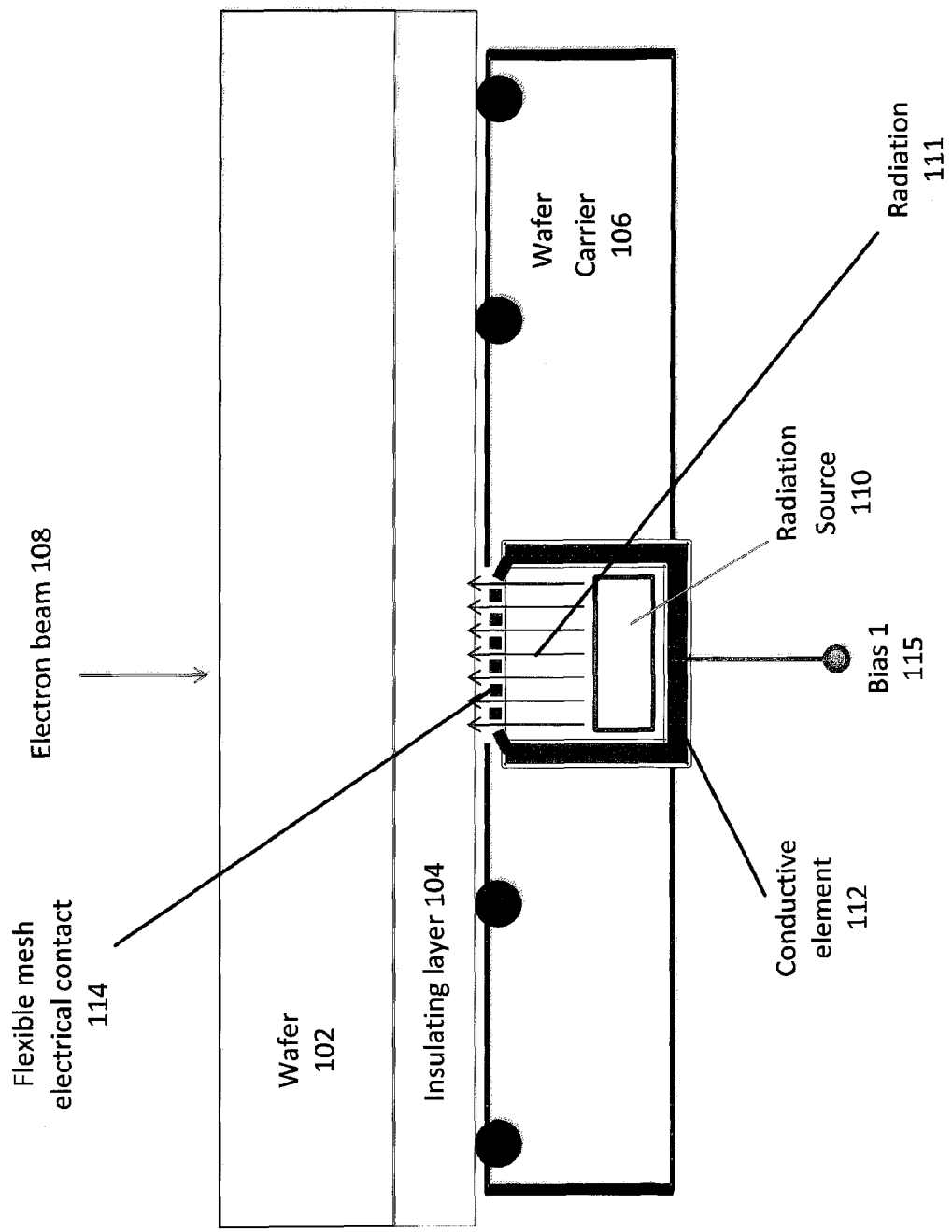
FIG. 8 is a cross-sectional diagram of an alternate apparatus to form an electrical conduction path through an insulating layer in accordance with an embodiment of the invention.

FIG. 8 is a cross-sectional diagram of an alternate apparatus 800 to form an electrical conduction path through an insulating layer in accordance with an embodiment of the invention. The apparatus 800 in FIG. 8 is similar to the apparatus 100 described above in relation to FIG. 1. However, while the apparatus 100 in FIG. 1 has two electrical contacts 114 and two radiation sources 110, the apparatus 800 in FIG. 8 has only one electrical contact 114 and one radiation source 110.

The apparatus 800 in FIG. 8 may be applied in cases where there is only one type of charging (i.e. only positive or only negative charging) to be drained. In contrast, the apparatus 100 in FIG. 1 has flexibility to drain either sign charge. For example, in electron beam instruments with variable landing energy, the charging may be of either sign.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus forming an electrical conduction path through an insulating layer on a surface of a substrate, the apparatus comprising:
a first radiation source configured to emit radiation to a first region of the insulating layer;
a first electrical contact configured to apply a first bias voltage to the first region;
a second radiation source configured to emit radiation to a second region of the insulating layer; and
a second electrical contact configured to apply a second bias voltage to the second region,
wherein a positive bias voltage is applied by the first electrical contact, and a negative bias voltage is applied by the second electrical contact.

2. The apparatus of claim 1, wherein the radiation from the first radiation source passes through openings in the first electrical contact so as to impinge upon portions of the first region, and the radiation from the second radiation source passes through openings in the second electrical contact so as to impinge upon portions of the second region.

3. The apparatus of claim 2, wherein the first and second electrical contacts comprise conductive meshes which apply the bias voltages to the regions, and wherein the radiation from the radiation sources passes through openings in the conductive meshes.

4. The apparatus of claim 1, wherein the bias voltages are determined by using current-voltage characteristic data for the insulating layer.

5. The apparatus of claim 1 further comprising:
an electron beam column for focusing an electron beam with a beam current onto the surface of the substrate.

6. The apparatus of claim 5, wherein a charging current is absorbed by the substrate from the beam current, and the apparatus conducts the charging current out of the substrate through the insulating layer.

7. The apparatus of claim 1, wherein the radiation sources generate ultraviolet light.

8. The apparatus of claim 1, wherein the radiation sources generate charged particles.

9. The apparatus of claim 8, wherein the charged particles comprise alpha particles.

10. The apparatus of claim 9, wherein the radiation source comprises americium.

11. A method of forming an electrical conduction path through an insulating layer, the method comprising:
emitting radiation to a first region of the insulating layer;
applying a first bias voltage to the first region;
emitting radiation to a second region of the insulating layer; and
applying a second bias voltage to the second region,
wherein a positive bias voltage is applied by the first electrical contact, and a negative bias voltage is applied by the second electrical contact.

12. The method of claim 11, wherein the radiation from the first radiation source passes through openings in the first electrical contact so as to impinge upon portions of the first region, and the radiation from the second radiation source passes through openings in the second electrical contact so as to impinge upon portions of the second region.

13. The method of claim 12, wherein the first and second electrical contacts comprise conductive meshes which apply the bias voltages to the regions, and wherein the radiation from the radiation sources passes through openings in the conductive meshes.

14. The method of claim 11 further comprising:
determining the bias voltages using current-voltage characteristic data for the insulating layer.

15. The method of claim 11 further comprising:
focusing an electron beam with a beam current onto the surface of the substrate;
absorbing into the substrate a charging current from the beam current; and
conducting the charging current out of the substrate through the insulating layer.

16. The method of claim 11, wherein the radiation sources generate ultraviolet light.

17. The method of claim 11, wherein the radiation sources generate charged particles.

18. The method of claim 17, wherein the charged particles comprise alpha particles.

19. The method of claim 18, wherein the radiation source comprises americium.

* * * * *